United States Patent
Venkatasubbaiah et al.

(10) Patent No.: US 11,861,169 B2
(45) Date of Patent: Jan. 2, 2024

(54) LAYOUT FORMAT FOR COMPRESSED DATA

(71) Applicant: NetApp Inc., Sunnyvale, CA (US)

(72) Inventors: Girish Hebbale Venkatasubbaiah, Karantaka (IN); Rahul Thapliyal, Karnataka (IN); Dnyaneshwar Nagorao Pawar, Bangalore (IN); Kartik Rathnakar, Karnataka (IN); Venkateswarlu Tella, Bangalore (IN); Ananthan Subramanian, San Ramon, CA (US)

(73) Assignee: NetApp, Inc., San Jose, CA (US)

( * ) Notice: Subject to any disclaimer, the term of this patent is extended or adjusted under 35 U.S.C. 154(b) by 172 days.

(21) Appl. No.: 17/028,020

(22) Filed: Sep. 22, 2020

(65) Prior Publication Data

US 2021/0405882 A1    Dec. 30, 2021

(30) Foreign Application Priority Data

Jun. 26, 2020    (IN) .............................. 202041027249

(51) Int. Cl.
*G06F 3/06*    (2006.01)
*G06F 16/215*    (2019.01)
(Continued)

(52) U.S. Cl.
CPC ............ *G06F 3/0608* (2013.01); *G06F 3/067* (2013.01); *G06F 3/0641* (2013.01);
(Continued)

(58) Field of Classification Search
CPC ...... G06F 3/067; G06F 3/0608; G06F 16/215; G06F 3/0641; G06F 16/285;
(Continued)

(56) References Cited

U.S. PATENT DOCUMENTS

| 9,317,218 B1 | 4/2016 | Botelho et al. |
| 2011/0167096 A1* | 7/2011 | Guo ........................ G06F 3/067 |
| | | 711/E12.002 |

(Continued)

FOREIGN PATENT DOCUMENTS

| EP | 2627095 A1 | 8/2013 |
| EP | 3059677 A1 | 8/2016 |
| EP | 3432168 A1 | 1/2019 |

OTHER PUBLICATIONS

"ADMAD: Application-Driven Metadata Aware De-duplication Archival Storage System", Sep. 2008, Chuanyi Liu, Yingpin Lu, Chunahi Shi, Guanlin Lu, David H.C.Du and Dong-Sheng Wang, Fifth IEEE International Workshop on Storage Architecture and Parallel I/Os, Computer Society, pp. 29-35.

(Continued)

*Primary Examiner* — David Yi
*Assistant Examiner* — Zubair Ahmed
(74) *Attorney, Agent, or Firm* — Cooper Legal Group, LLC

(57) ABSTRACT

Techniques are provided for a layout format for compressed data. A first set of data blocks are grouped into a first group based upon a first frequency of access to the first set of data blocks. A second set of data blocks are grouped into a second group based upon a second frequency of access to the second set of data blocks. The first set of data blocks are compressed into a first compression group using a first compression algorithm. The second set of data blocks are compressed into a second compression group using a second compression algorithm.

26 Claims, 9 Drawing Sheets

(51) Int. Cl.
  *G06F 16/25*  (2019.01)
  *H03M 7/30*  (2006.01)
  *G06F 16/28*  (2019.01)

(52) U.S. Cl.
  CPC .......... *G06F 16/215* (2019.01); *G06F 16/258* (2019.01); *G06F 16/285* (2019.01); *H03M 7/3091* (2013.01)

(58) Field of Classification Search
  CPC ...... G06F 3/0661; G06F 16/174; G06F 3/064; G06F 16/258; H03M 7/6088; H03M 7/3091; H03M 7/4031; H03M 7/3095
  USPC .................................................. 711/170, 100
  See application file for complete search history.

(56) References Cited

U.S. PATENT DOCUMENTS

| | | | |
|---|---|---|---|
| 2011/0185149 | A1 | 7/2011 | Gruhl et al. |
| 2012/0109909 | A1* | 5/2012 | Hugly ................ H03M 7/3084 707/693 |
| 2014/0095439 | A1* | 4/2014 | Ram ..................... G06F 3/0671 707/640 |
| 2014/0195500 | A1* | 7/2014 | Amit ................... G06F 16/2365 707/693 |
| 2016/0254824 | A1* | 9/2016 | Blanchflower ..... H03M 7/6064 341/87 |
| 2019/0114102 | A1* | 4/2019 | Chen ....................... G06F 3/061 |
| 2020/0042219 | A1 | 2/2020 | Wang et al. |
| 2021/0278990 | A1* | 9/2021 | Choi ..................... G06F 3/0608 |

OTHER PUBLICATIONS

"Multi-Level Comparison of Data Deduplication in a Backup Scenario", May 2009, Dirk Meister and Andre Brinkmann, Proceedings of System 2009: The Israeli Experimental Systems Conference, Article #8, pp. 1-12.

The International Search Report and Written Opinion cited in Application No. PCT/US2021/039284 dated Oct. 14, 2021, 19 pgs.

International Preliminary Report on Patentability and Written Opinion corresponding to PCT/US2021/039284; dated Dec. 13, 2022; 12 Pgs.

* cited by examiner

LAYOUT FORMAT FOR COMPRESSED DATA

RELATED APPLICATIONS

This application claims priority to India patent application, titled "LAYOUT FORMAT FOR COMPRESSED DATA", filed on Jun. 26, 2020 and accorded Indian Application No.: 202041027249, which is incorporated herein by reference.

BACKGROUND

Many storage environments provide storage efficiency functionality for data stored on behalf of clients within the storage environments. For example a node of a storage environment (e.g., a server, a virtual machine, hardware, software, or combination thereof) may provide compression functionality for user data. The node may compress the user data so that less storage is consumed. In another example, the node may provide deduplication functionality for the user data. The node may deduplicate the user data in order to identify and eliminate redundantly stored data. In this way, the node may implement various types of storage efficiency functionality in order to more efficiently store data on behalf of clients.

DETAILED DESCRIPTION

Figure 1:
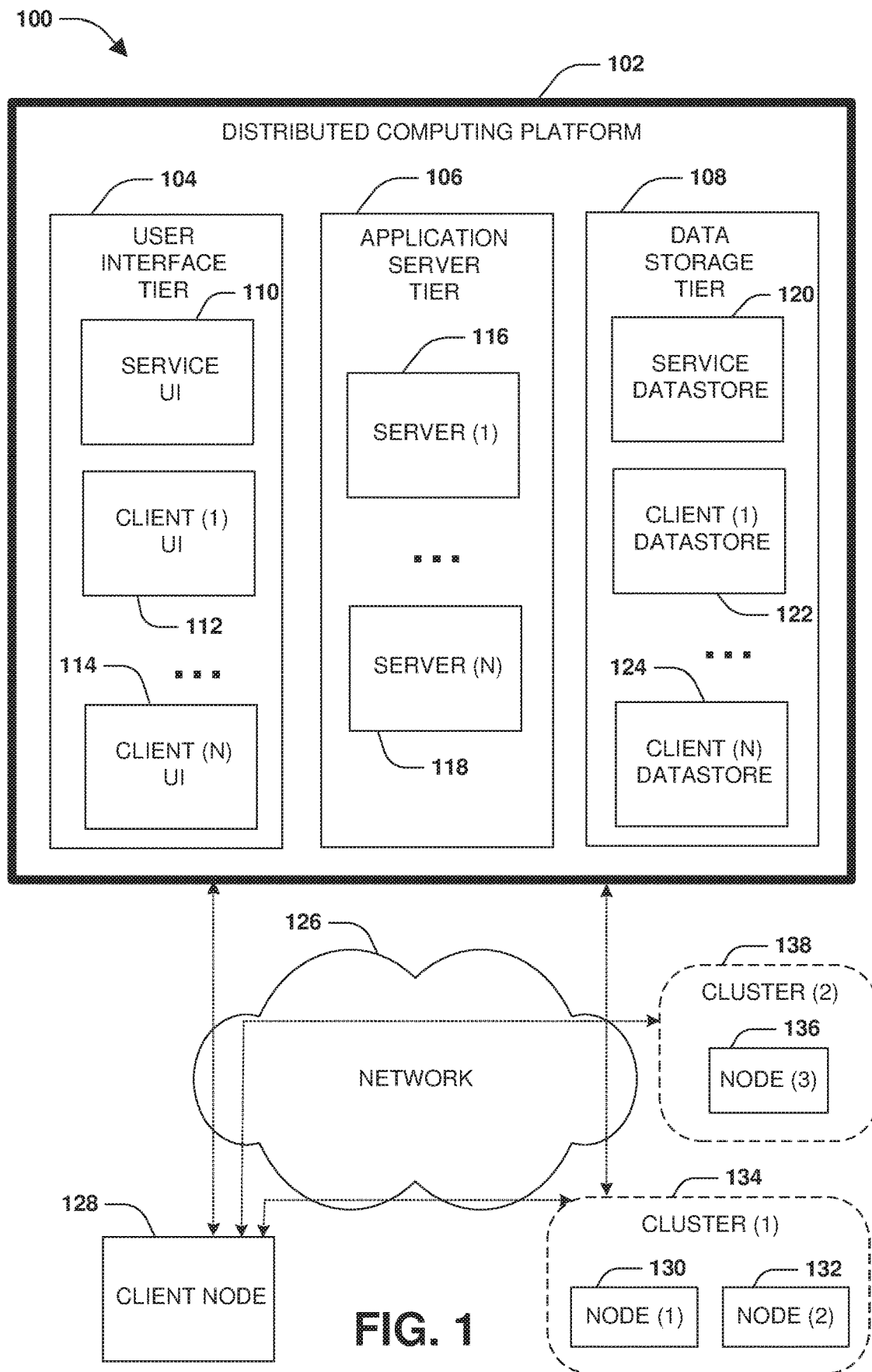
FIG. 1 is a block diagram illustrating an example computing environment in which an embodiment of the invention may be implemented.

Some examples of the claimed subject matter are now described with reference to the drawings, where like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. Nothing in this detailed description is admitted as prior art.

The techniques described herein are directed to a format and layout for compressed data. This format provides for container level compression, such as compression of a container as opposed to compression of a single file at a file level. The format allows for data blocks to be compressed in variable chunk sizes and using different compression algorithms without impacting any prior deduplication storage savings, and while being transparent to data management capabilities of a file system associated with the data being compressed. With this format, different compression algorithms can be applied for frequently accessed (hot) data, infrequently accessed (cold) data, backup/secondary data, etc. Furthermore, this format allows for the combination of similar types of data blocks to be compressed together in order to achieve better compression savings and reduced storage utilization. With this format, metadata, used to interpret compressed data and describing how to correctly decompress the compressed data, is stored within disk blocks at the start of the compressed data. In this way, a file does not need to maintain any metadata corresponding to compression since such metadata is stored within the disk blocks comprising the compressed data. Thus, each data block has enough information to read and decompress compressed data of the data block without having to maintain additional information describing other data blocks compressed with the data block. Because each compressed data block is self-sufficient to read and decompress the compressed data block, storage savings from prior deduplication is retain since each compressed data block can be deduplicated individually at a logical data level. In this way, additional storage savings can be achieved from performing compression using this format and layout, along with retaining storage savings from prior deduplication.

A node, such as a server, a computing device, a virtual machine, a storage service, hardware, software, or combination thereof, may store data on behalf of client devices. The node may also provide various types of storage efficiency functionality, such as deduplication, compression, etc. As provided herein, a layout format is provided for container level compression of data blocks. The layout format allows data blocks to be compressed in variable chunk sizes using different compression algorithms without impacting deduplication savings (e.g., storage savings from reducing duplicate data) while being transparent to data management capabilities of a file system hosted by the node. With this layout format, different compression algorithms can be applied to different types of data, such as frequently/recently accessed data, infrequently accessed data, backup data (e.g., a backup copy of primary data being accessed by a client device), user data, metadata, etc. In this way, the layout format allows for the combination of similar types of data blocks to be grouped and compressed together in order to achieve better compression savings.

The layout format combines a set of data blocks together as a group, and compresses the group together as a compression group comprising compression data stored within disk blocks of storage. The compression group is stored in a variable number of disk blocks. Metadata, used to interpret the compressed data and describing how to correctly decompress the compressed data within the compression group, is stored within the disk blocks themselves at the start of compressed data. In this way, a data file that has been compressed does not need to keep any metadata corresponding to compression. Thus, the layout format is independent from data management operations and is transparent. This means that each data block has enough information to read and decompress the data within the data block without knowing which other data blocks are compressed together. So even if some of the data blocks are overwritten, there is no need to decompress the data and write other blocks in an uncompressed state. Accordingly, the layout format solves the read-modify-write problem for compressed data, where the compressed data otherwise would have to be decompressed and read, modified, and then written back.

Since each data block, which is compressed, is self-sufficient to read and decompress the data within that data block, the data block can be deduplicated individually at a logical data level. In this way, even if a variable number of data blocks are combined and compressed together as a compression group or are compressed with different compression algorithms, deduplication storage savings are not impacted. With the layout format, each data block will point to a set of disk blocks of storage holding the compressed data. In an example, one logical block of data could be pointing to more than one physical disk block. These physical disk blocks may be located anywhere on storage. In an example, the representation of the physical disk block locations within file system metadata may be simplified by applying an encoding. In an example, the physical disk blocks where compressed data is stored may be assumed to be contiguous disk blocks. In this way, a disk location of the data can be easily represented in a file system indirect block by encoding the disk block information as a starting disk block number and a count of blocks from the start disk block number where a particular disk block is located (an offset).

In an example, the layout format can have one logical block pointing to multiple disk blocks. So, when a file block is overwritten or some of the file blocks is deduplicated, it is possible that eventually more disk space is consumed as compared to actual data. This can be solved by performing garbage collection to free extra disk blocks so that the freed disk blocks are available to store other data. In an example, garbage collection work is done asynchronously. With this layout format, each logical block takes/consumes a reference count on the disk blocks containing compressed data. By comparing the number of logical blocks, pointing to a set of disk blocks, with a count of disk blocks, a determination may be made that the disk blocks are to be freed by garbage collection. If the number of logical blocks, pointing to disk blocks, is less than the count of disk blocks, then more disk space is being consumed as compared to logical data. Thus, garbage collection may be performed because some of the disk blocks are no longer referenced and can be freed for storing other data.

In an example, the garbage collection work is done asynchronously in the background (e.g., a background process may perform the garbage collection work in the background with respect to client I/O processing). Garbage collection can be tuned such that it has a minimal impact on I/O performance. As part of garbage collection, compressed data will be decompressed, and extra disk blocks will be freed. The remaining data blocks can be combined with other garbage collected data blocks and compressed again in order to obtain storage efficiency savings. This garbage collection will not impact deduplication savings, and so the garbage collection process can compress the data independent of how the blocks were previously deduplicated or compressed. Since the disk space has yet to be garbage collected and is thus pending to be freed, the disk space can be effectively counted as free space by the file system. As long as there is enough space available in the file system for future use, the garbage collection work can be deferred for a longer time. A threshold can be maintained to trigger the garbage collection work. In an example, the threshold can be a percentage of disk space (e.g., garbage collection work can be triggered when disk blocks to be garbage collected are more than 2% of file system space).

The layout format may implement compression at a container file layer. In this way, deduplication can be performed before compression of the data blocks. Also, compression remains independent of whether data blocks are part of a snapshot of the file system or not. To compress the data at a container file layer, multiple data blocks of data are combined in a group, and then this combined group of data will be compressed using some compression algorithm. The compressed data is then stored within the disk blocks of storage. The disk blocks where the compressed data is stored for a group of container file blocks may be referred to as a compression data extent. The group of blocks on the container file will be pointing to the compression data extent in file system indirect block metadata.

In an example, in order to reduce the footprint of representing the compression data extent in a file system indirect block, an assumption is made that the disk blocks where compressed data is stored on physical storage are contiguous blocks within the storage. In this way, a file system indirect block can point to a compression data extent by encoding a list of disk blocks in much smaller space. This assumption can be relaxed by encoding the disk blocks of a compression data extent in an indirect block, or by having a completely different format for indirect blocks, such as by maintaining an overflow block for an indirect block where additional disk block information can be stored within the overflow block.

Since the metadata, specifying how to interpret the compressed data and how to correctly decompressed the compressed data, is maintain in the disk blocks themselves at the start of compressed data, a container file does not need to keep any metadata corresponding to compression. This keeps data management operations independent and transparent of this layout format.

Since this layout format does not require any specific metadata to be kept at a container file level, each group of file blocks which are compressed together can have independent group sizes and/or can be compressed with any desirable compression algorithm. Thus, this layout format provides the flexibility of compressing frequently accessed data, infrequently accessed data, user data, metadata, and secondary backup data independently.

The layout format of compression at a container file level provides for the ability to perform deduplication before compression. In an example, deduplication of data is done at a file level, such as at a logical 4K block boundary. If a block is deduplicated, then the block will point to the same duplicate block on the container file. So, by doing compression at the container file level with this layout format, deduplication can be done on a logical block boundary without worrying about how (e.g., in which chunk size and with what algorithm) the data will be subsequently compressed after being deduplicated.

FIG. 1 is a diagram illustrating an example operating environment 100 in which an embodiment of the techniques described herein may be implemented. In one example, the techniques described herein may be implemented within a client device 128, such as a laptop, a tablet, a personal computer, a mobile device, a server, a virtual machine, a wearable device, etc. In another example, the techniques described herein may be implemented within one or more nodes, such as a first node 130 and/or a second node 132 within a first cluster 134, a third node 136 within a second cluster 138, etc. A node may comprise a storage controller, a server, an on-premise device, a virtual machine such as a storage virtual machine, hardware, software, or combination thereof. The one or more nodes may be configured to manage the storage and access to data on behalf of the client device 128 and/or other client devices. In another example, the techniques described herein may be implemented within a distributed computing platform 102 such as a cloud computing environment (e.g., a cloud storage environment, a multi-tenant platform, a hyperscale infrastructure comprising scalable server architectures and virtual networking, etc.) configured to manage the storage and access to data on behalf of client devices and/or nodes.

In yet another example, at least some of the techniques described herein are implemented across one or more of the client device 128, the one or more nodes 130, 132, and/or 136, and/or the distributed computing platform 102. For example, the client device 128 may transmit operations, such as data operations to read data and write data and metadata operations (e.g., a create file operation, a rename directory operation, a resize operation, a set attribute operation, etc.), over a network 126 to the first node 130 for implementation by the first node 130 upon storage. The first node 130 may store data associated with the operations within volumes or other data objects/structures hosted within locally attached storage, remote storage hosted by other computing devices accessible over the network 126, storage provided by the distributed computing platform 102, etc. The first node 130 may replicate the data and/or the operations to other computing devices, such as to the second node 132, the third node 136, a storage virtual machine executing within the distributed computing platform 102, etc., so that one or more replicas of the data are maintained. For example, the third node 136 may host a destination storage volume that is maintained as a replica of a source storage volume of the first node 130. Such replicas can be used for disaster recovery and failover.

In an embodiment, the techniques described herein are implemented by a storage operating system or are implemented by a separate module that interacts with the storage operating system. The storage operating system may be hosted by the client device, 128, a node, the distributed computing platform 102, or across a combination thereof. In an example, the storage operating system may execute within a storage virtual machine, a hyperscaler, or other computing environment. The storage operating system may implement a one or more file systems to logically organize data within storage devices as one or more storage objects and provide a logical/virtual representation of how the storage objects are organized on the storage devices (e.g., a file system tailored for block-addressable storage, a file system tailored for byte-addressable storage such as persistent memory). A storage object may comprise any logically definable storage element stored by the storage operating system (e.g., a volume stored by the first node 130, a cloud object stored by the distributed computing platform 102, etc.). Each storage object may be associated with a unique identifier that uniquely identifies the storage object. For example, a volume may be associated with a volume identifier uniquely identifying that volume from other volumes. The storage operating system also manages client access to the storage objects.

The storage operating system may implement a file system for logically organizing data. For example, the storage operating system may implement a write anywhere file layout for a volume where modified data for a file may be written to any available location as opposed to a write-in-place architecture where modified data is written to the original location, thereby overwriting the previous data. In an example, the file system may be implemented through a file system layer that stores data of the storage objects in an on-disk format representation that is block-based (e.g., data is stored within 4 kilobyte blocks and inodes are used to identify files and file attributes such as creation time, access permissions, size and block location, etc.).

In an example, deduplication may be implemented by a deduplication module associated with the storage operating system. Deduplication is performed to improve storage efficiency. One type of deduplication is inline deduplication that ensures blocks are deduplicated before being written to a storage device. Inline deduplication uses a data structure, such as an incore hash store, which maps fingerprints of data to data blocks of the storage device storing the data. Whenever data is to be written to the storage device, a fingerprint of that data is calculated and the data structure is looked up using the fingerprint to find duplicates (e.g., potentially duplicate data already stored within the storage device). If duplicate data is found, then the duplicate data is loaded from the storage device and a byte by byte comparison may be performed to ensure that the duplicate data is an actual duplicate of the data to be written to the storage device. If the data to be written is a duplicate of the loaded duplicate data, then the data to be written to disk is not redundantly stored to the storage device. Instead, a pointer or other reference is stored in the storage device in place of the data to be written to the storage device. The pointer points to the duplicate data already stored in the storage device. A reference count for the data may be incremented to indicate that the pointer now references the data. If at some point the pointer no longer references the data (e.g., the deduplicated data is deleted and thus no longer references the data in the storage device), then the reference count is decremented. In this way, inline deduplication is able to deduplicate data before the data is written to disk. This improves the storage efficiency of the storage device.

Background deduplication is another type of deduplication that deduplicates data already written to a storage device. Various types of background deduplication may be implemented. In an example of background deduplication, data blocks that are duplicated between files are rearranged within storage units such that one copy of the data occupies physical storage. References to the single copy can be inserted into a file system structure such that all files or containers that contain the data refer to the same instance of the data. Deduplication can be performed on a data storage device block basis. In an example, data blocks on a storage device can be identified using a physical volume block number. The physical volume block number uniquely identifies a particular block on the storage device. Additionally, blocks within a file can be identified by a file block number. The file block number is a logical block number that indicates the logical position of a block within a file relative to other blocks in the file. For example, file block number 0 represents the first block of a file, file block number 1 represents the second block, etc. File block numbers can be mapped to a physical volume block number that is the actual data block on the storage device. During deduplication operations, blocks in a file that contain the same data are deduplicated by mapping the file block number for the block to the same physical volume block number, and maintaining a reference count of the number of file block numbers that map to the physical volume block number. For example, assume that file block number 0 and file block number 5 of a file contain the same data, while file block numbers 1-4 contain unique data. File block numbers 1-4 are mapped to different physical volume block numbers. File block number 0 and file block number 5 may be mapped to the same physical volume block number, thereby reducing storage requirements for the file. Similarly, blocks in different files that contain the same data can be mapped to the same physical volume block number. For example, if file block number 0 of file A contains the same data as file block number 3 of file B, file block number 0 of file A may be mapped to the same physical volume block number as file block number 3 of file B.

In another example of background deduplication, a changelog is utilized to track blocks that are written to the storage device. Background deduplication also maintains a fingerprint database (e.g., a flat metafile) that tracks all unique block data such as by tracking a fingerprint and other filesystem metadata associated with block data. Background deduplication can be periodically executed or triggered based upon an event such as when the changelog fills beyond a threshold. As part of background deduplication, data in both the changelog and the fingerprint database is sorted based upon fingerprints. This ensures that all duplicates are sorted next to each other. The duplicates are moved to a dup file. The unique changelog entries are moved to the fingerprint database, which will serve as duplicate data for a next deduplication operation. In order to optimize certain filesystem operations needed to deduplicate a block, duplicate records in the dup file are sorted in certain filesystem sematic order (e.g., inode number and block number). Next, the duplicate data is loaded from the storage device and a whole block byte by byte comparison is performed to make sure duplicate data is an actual duplicate of the data to be written to the storage device. After, the block in the changelog is modified to point directly to the duplicate data as opposed to redundantly storing data of the block.

In an example, deduplication operations performed by a data deduplication layer of a node can be leveraged for use on another node during data replication operations. For example, the first node 130 may perform deduplication operations to provide for storage efficiency with respect to data stored on a storage volume. The benefit of the deduplication operations performed on first node 130 can be provided to the second node 132 with respect to the data on first node 130 that is replicated to the second node 132. In some aspects, a data transfer protocol, referred to as the LRSE (Logical Replication for Storage Efficiency) protocol, can be used as part of replicating consistency group differences from the first node 130 to the second node 132. In the LRSE protocol, the second node 132 maintains a history buffer that keeps track of data blocks that it has previously received. The history buffer tracks the physical volume block numbers and file block numbers associated with the data blocks that have been transferred from first node 130 to the second node 132. A request can be made of the first node 130 to not transfer blocks that have already been transferred. Thus, the second node 132 can receive deduplicated data from the first node 130, and will not need to perform deduplication operations on the deduplicated data replicated from first node 130.

In an example, the first node 130 may preserve deduplication of data that is transmitted from first node 130 to the distributed computing platform 102. For example, the first node 130 may create an object comprising deduplicated data. The object is transmitted from the first node 130 to the distributed computing platform 102 for storage. In this way, the object within the distributed computing platform 102 maintains the data in a deduplicated state. Furthermore, deduplication may be preserved when deduplicated data is transmitted/replicated/mirrored between the client device 128, the first node 130, the distributed computing platform 102, and/or other nodes or devices.

In an example, compression may be implemented by a compression module associated with the storage operating system. The compression module may utilize various types of compression techniques to replace longer sequences of data (e.g., frequently occurring and/or redundant sequences) with shorter sequences, such as by using Huffman coding, arithmetic coding, compression dictionaries, etc. For example, an decompressed portion of a file may comprise "ggggnnnnnnnqqqqqqqqqq", which is compressed to become "4g6n10q". In this way, the size of the file can be reduced to improve storage efficiency. Compression may be implemented for compression groups. A compression group may correspond to a compressed group of blocks. The compression group may be represented by virtual volume block numbers. The compression group may comprise contiguous or non-contiguous blocks.

Compression may be preserved when compressed data is transmitted/replicated/mirrored between the client device 128, a node, the distributed computing platform 102, and/or other nodes or devices. For example, an object may be created by the first node 130 to comprise compressed data. The object is transmitted from the first node 130 to the distributed computing platform 102 for storage. In this way, the object within the distributed computing platform 102 maintains the data in a compressed state.

In an example, various types of synchronization may be implemented by a synchronization module associated with the storage operating system. In an example, synchronous replication may be implemented, such as between the first node 130 and the second node 132. It may be appreciated that the synchronization module may implement synchronous replication between any devices within the operating environment 100, such as between the first node 130 of the first cluster 134 and the third node 136 of the second cluster 138 and/or between a node of a cluster and an instance of a node or virtual machine in the distributed computing platform 102.

As an example, during synchronous replication, the first node 130 may receive a write operation from the client device 128. The write operation may target a file stored within a volume managed by the first node 130. The first node 130 replicates the write operation to create a replicated write operation. The first node 130 locally implements the write operation upon the file within the volume. The first node 130 also transmits the replicated write operation to a synchronous replication target, such as the second node 132 that maintains a replica volume as a replica of the volume maintained by the first node 130. The second node 132 will execute the replicated write operation upon the replica volume so that the file within the volume and the replica volume comprises the same data. After, the second node 132 will transmit a success message to the first node 130. With synchronous replication, the first node 130 does not respond with a success message to the client device 128 for the write operation until both the write operation is executed upon the volume and the first node 130 receives the success message that the second node 132 executed the replicated write operation upon the replica volume.

In another example, asynchronous replication may be implemented, such as between the first node 130 and the third node 136. It may be appreciated that the synchronization module may implement asynchronous replication between any devices within the operating environment 100, such as between the first node 130 of the first cluster 134 and the distributed computing platform 102. In an example, the first node 130 may establish an asynchronous replication relationship with the third node 136. The first node 130 may capture a baseline snapshot of a first volume as a point in time representation of the first volume. The first node 130 may utilize the baseline snapshot to perform a baseline transfer of the data within the first volume to the third node 136 in order to create a second volume within the third node 136 comprising data of the first volume as of the point in time at which the baseline snapshot was created.

After the baseline transfer, the first node 130 may subsequently create snapshots of the first volume over time. As part of asynchronous replication, an incremental transfer is performed between the first volume and the second volume. In particular, a snapshot of the first volume is created. The snapshot is compared with a prior snapshot that was previously used to perform the last asynchronous transfer (e.g., the baseline transfer or a prior incremental transfer) of data to identify a difference in data of the first volume between the snapshot and the prior snapshot (e.g., changes to the first volume since the last asynchronous transfer). Accordingly, the difference in data is incrementally transferred from the first volume to the second volume. In this way, the second volume will comprise the same data as the first volume as of the point in time when the snapshot was created for performing the incremental transfer. It may be appreciated that other types of replication may be implemented, such as semi-sync replication.

In an embodiment, the first node 130 may store data or a portion thereof within storage hosted by the distributed computing platform 102 by transmitting the data within objects to the distributed computing platform 102. In one example, the first node 130 may locally store frequently accessed data within locally attached storage. Less frequently accessed data may be transmitted to the distributed computing platform 102 for storage within a data storage tier 108. The data storage tier 108 may store data within a service data store 120, and may store client specific data within client data stores assigned to such clients such as a client (1) data store 122 used to store data of a client (1) and a client (N) data store 124 used to store data of a client (N). The data stores may be physical storage devices or may be defined as logical storage, such as a virtual volume, LUNs, or other logical organizations of data that can be defined across one or more physical storage devices. In another example, the first node 130 transmits and stores all client data to the distributed computing platform 102. In yet another example, the client device 128 transmits and stores the data directly to the distributed computing platform 102 without the use of the first node 130.

The management of storage and access to data can be performed by one or more storage virtual machines (SVMs) or other storage applications that provide software as a service (SaaS) such as storage software services. In one example, an SVM may be hosted within the client device 128, within the first node 130, or within the distributed computing platform 102 such as by the application server tier 106. In another example, one or more SVMs may be hosted across one or more of the client device 128, the first node 130, and the distributed computing platform 102. The one or more SVMs may host instances of the storage operating system.

In an example, the storage operating system may be implemented for the distributed computing platform 102. The storage operating system may allow client devices to access data stored within the distributed computing platform 102 using various types of protocols, such as a Network File System (NFS) protocol, a Server Message Block (SMB) protocol and Common Internet File System (CIFS), and Internet Small Computer Systems Interface (iSCSI), and/or other protocols. The storage operating system may provide various storage services, such as disaster recovery (e.g., the ability to non-disruptively transition client devices from accessing a primary node that has failed to a secondary node that is taking over for the failed primary node), backup and archive function, replication such as asynchronous and/or synchronous replication, deduplication, compression, high availability storage, cloning functionality (e.g., the ability to clone a volume, such as a space efficient flex clone), snapshot functionality (e.g., the ability to create snapshots and restore data from snapshots), data tiering (e.g., migrating infrequently accessed data to slower/cheaper storage), encryption, managing storage across various platforms such as between on-premise storage systems and multiple cloud systems, etc.

In one example of the distributed computing platform 102, one or more SVMs may be hosted by the application server tier 106. For example, a server (1) 116 is configured to host SVMs used to execute applications such as storage applications that manage the storage of data of the client (1) within the client (1) data store 122. Thus, an SVM executing on the server (1) 116 may receive data and/or operations from the client device 128 and/or the first node 130 over the network 126. The SVM executes a storage application and/or an instance of the storage operating system to process the operations and/or store the data within the client (1) data store 122. The SVM may transmit a response back to the client device 128 and/or the first node 130 over the network 126, such as a success message or an error message. In this way, the application server tier 106 may host SVMs, services, and/or other storage applications using the server (1) 116, the server (N) 118, etc.

A user interface tier 104 of the distributed computing platform 102 may provide the client device 128 and/or the first node 130 with access to user interfaces associated with the storage and access of data and/or other services provided by the distributed computing platform 102. In an example, a service user interface 110 may be accessible from the distributed computing platform 102 for accessing services subscribed to by clients and/or nodes, such as data replication services, application hosting services, data security services, human resource services, warehouse tracking services, accounting services, etc. For example, client user interfaces may be provided to corresponding clients, such as a client (1) user interface 112, a client (N) user interface 114, etc. The client (1) can access various services and resources subscribed to by the client (1) through the client (1) user interface 112, such as access to a web service, a development environment, a human resource application, a warehouse tracking application, and/or other services and resources provided by the application server tier 106, which may use data stored within the data storage tier 108.

The client device 128 and/or the first node 130 may subscribe to certain types and amounts of services and resources provided by the distributed computing platform 102. For example, the client device 128 may establish a subscription to have access to three virtual machines, a certain amount of storage, a certain type/amount of data redundancy, a certain type/amount of data security, certain service level agreements (SLAs) and service level objectives (SLOs), latency guarantees, bandwidth guarantees, access to execute or host certain applications, etc. Similarly, the first node 130 can establish a subscription to have access to certain services and resources of the distributed computing platform 102.

As shown, a variety of clients, such as the client device 128 and the first node 130, incorporating and/or incorporated into a variety of computing devices may communicate with the distributed computing platform 102 through one or more networks, such as the network 126. For example, a client may incorporate and/or be incorporated into a client application (e.g., software) implemented at least in part by one or more of the computing devices.

Examples of suitable computing devices include personal computers, server computers, desktop computers, nodes, storage servers, nodes, laptop computers, notebook computers, tablet computers or personal digital assistants (PDAs), smart phones, cell phones, and consumer electronic devices incorporating one or more computing device components, such as one or more electronic processors, microprocessors, central processing units (CPU), or controllers. Examples of suitable networks include networks utilizing wired and/or wireless communication technologies and networks operating in accordance with any suitable networking and/or communication protocol (e.g., the Internet). In use cases involving the delivery of customer support services, the computing devices noted represent the endpoint of the customer support delivery process, i.e., the consumer's device.

The distributed computing platform 102, such as a multi-tenant business data processing platform or cloud computing environment, may include multiple processing tiers, including the user interface tier 104, the application server tier 106, and a data storage tier 108. The user interface tier 104 may maintain multiple user interfaces, including graphical user interfaces and/or web-based interfaces. The user interfaces may include the service user interface 110 for a service to provide access to applications and data for a client (e.g., a "tenant") of the service, as well as one or more user interfaces that have been specialized/customized in accordance with user specific requirements (e.g., as discussed above), which may be accessed via one or more APIs.

The service user interface 110 may include components enabling a tenant to administer the tenant's participation in the functions and capabilities provided by the distributed computing platform 102, such as accessing data, causing execution of specific data processing operations, etc. Each processing tier may be implemented with a set of computers, virtualized computing environments such as a storage virtual machine or storage virtual server, and/or computer components including computer servers and processors, and may perform various functions, methods, processes, or operations as determined by the execution of a software application or set of instructions.

The data storage tier 108 may include one or more data stores, which may include the service data store 120 and one or more client data stores 122-124. Each client data store may contain tenant-specific data that is used as part of providing a range of tenant-specific business and storage services or functions, including but not limited to ERP, CRM, eCommerce, Human Resources management, payroll, storage services, etc. Data stores may be implemented with any suitable data storage technology, including structured query language (SQL) based relational database management systems (RDBMS), file systems hosted by operating systems, object storage, etc.

The distributed computing platform 102 may be a multi-tenant and service platform operated by an entity in order to provide multiple tenants with a set of business related applications, data storage, and functionality. These applications and functionality may include ones that a business uses to manage various aspects of its operations. For example, the applications and functionality may include providing web-based access to business information systems, thereby allowing a user with a browser and an Internet or intranet connection to view, enter, process, or modify certain types of business information or any other type of information.

Figure 2:
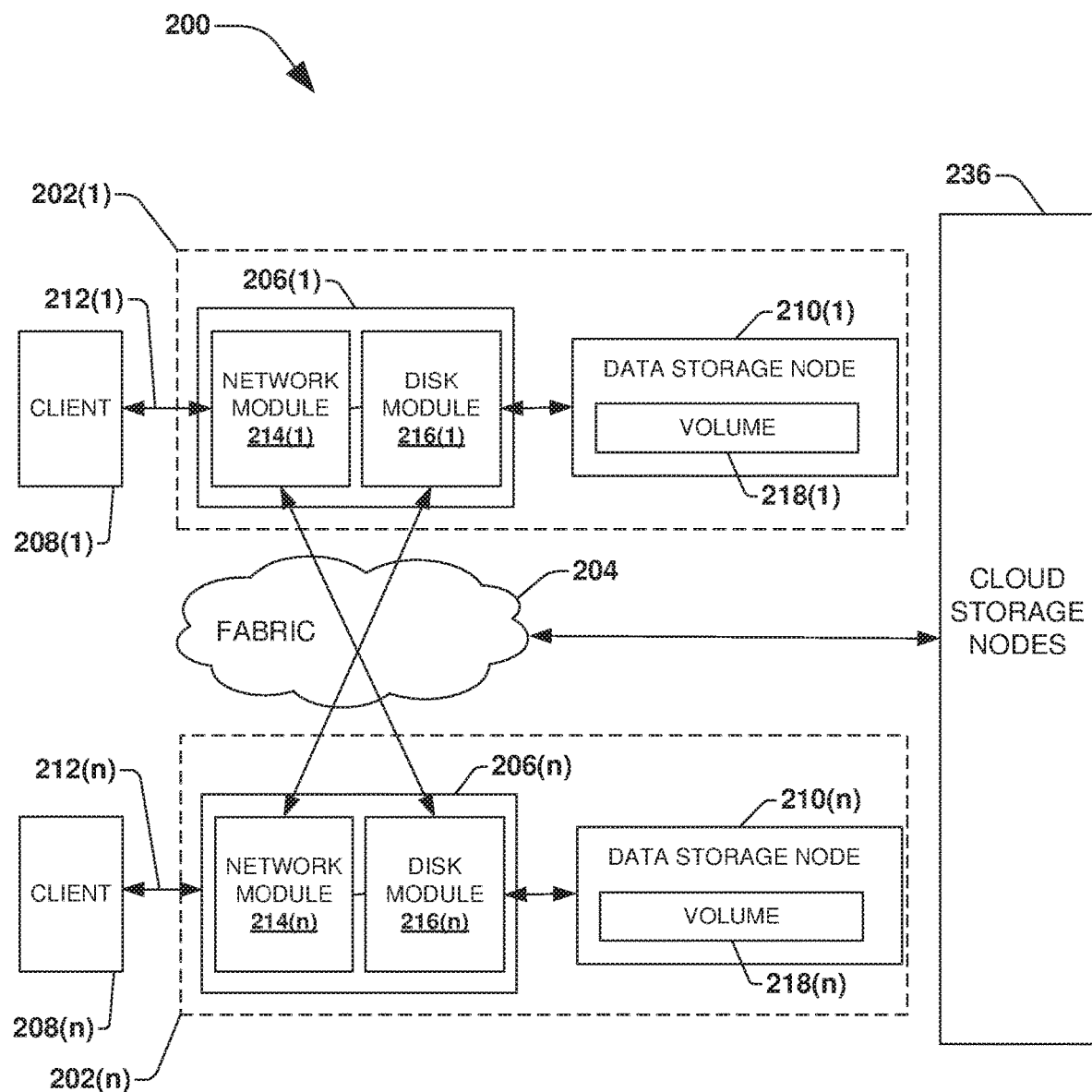
FIG. 2 is a block diagram illustrating a network environment with exemplary node computing devices.

A clustered network environment 200 that may implement one or more aspects of the techniques described and illustrated herein is shown in FIG. 2. The clustered network environment 200 includes data storage apparatuses 202(1)-202(n) that are coupled over a cluster or cluster fabric 204 that includes one or more communication network(s) and facilitates communication between the data storage apparatuses 202(1)-202(n) (and one or more modules, components, etc. therein, such as, node computing devices 206(1)-206(n), for example), although any number of other elements or components can also be included in the clustered network environment 200 in other examples. This technology provides a number of advantages including methods, non-transitory computer readable media, and computing devices that implement the techniques described herein.

In this example, node computing devices 206(1)-206(n) can be primary or local storage controllers or secondary or remote storage controllers that provide client devices 208(1)-208(n) with access to data stored within data storage devices 210(1)-210(n) and cloud storage device(s) 236 (also referred to as cloud storage node(s)). The node computing devices 206(1)-206(n) may be implemented as hardware, software (e.g., a storage virtual machine), or combination thereof.

The data storage apparatuses 202(1)-202(n) and/or node computing devices 206(1)-206(n) of the examples described and illustrated herein are not limited to any particular geographic areas and can be clustered locally and/or remotely via a cloud network, or not clustered in other examples. Thus, in one example the data storage apparatuses 202(1)-202(n) and/or node computing device 206(1)-206(n) can be distributed over a plurality of storage systems located in a plurality of geographic locations (e.g., located on-premise, located within a cloud computing environment, etc.); while in another example a clustered network can include data storage apparatuses 202(1)-202(n) and/or node computing device 206(1)-206(n) residing in a same geographic location (e.g., in a single on-site rack).

In the illustrated example, one or more of the client devices 208(1)-208(n), which may be, for example, personal computers (PCs), computing devices used for storage (e.g., storage servers), or other computers or peripheral devices, are coupled to the respective data storage apparatuses 202(1)-202(n) by network connections 212(1)-212(n). Network connections 212(1)-212(n) may include a local area network (LAN) or wide area network (WAN) (i.e., a cloud network), for example, that utilize TCP/IP and/or one or more Network Attached Storage (NAS) protocols, such as a Common Internet Filesystem (CIFS) protocol or a Network Filesystem (NFS) protocol to exchange data packets, a Storage Area Network (SAN) protocol, such as Small Computer System Interface (SCSI) or Fiber Channel Protocol (FCP), an object protocol, such as simple storage service (S3), and/or non-volatile memory express (NVMe), for example.

Illustratively, the client devices 208(1)-208(n) may be general-purpose computers running applications and may interact with the data storage apparatuses 202(1)-202(n) using a client/server model for exchange of information. That is, the client devices 208(1)-208(n) may request data from the data storage apparatuses 202(1)-202(n) (e.g., data on one of the data storage devices 210(1)-210(n) managed by a network storage controller configured to process I/O commands issued by the client devices 208(1)-208(n)), and the data storage apparatuses 202(1)-202(n) may return results of the request to the client devices 208(1)-208(n) via the network connections 212(1)-212(n).

The node computing devices 206(1)-206(n) of the data storage apparatuses 202(1)-202(n) can include network or host nodes that are interconnected as a cluster to provide data storage and management services, such as to an enterprise having remote locations, cloud storage (e.g., a storage endpoint may be stored within cloud storage device(s) 236), etc., for example. Such node computing devices 206(1)-206(n) can be attached to the cluster fabric 204 at a connection point, redistribution point, or communication endpoint, for example. One or more of the node computing devices 206(1)-206(n) may be capable of sending, receiving, and/or forwarding information over a network communications channel, and could comprise any type of device that meets any or all of these criteria.

In an example, the node computing devices 206(1) and 206(n) may be configured according to a disaster recovery configuration whereby a surviving node provides switchover access to the storage devices 210(1)-210(n) in the event a disaster occurs at a disaster storage site (e.g., the node computing device 206(1) provides client device 212(n) with switchover data access to data storage devices 210(n) in the event a disaster occurs at the second storage site). In other examples, the node computing device 206(n) can be configured according to an archival configuration and/or the node computing devices 206(1)-206(n) can be configured based on another type of replication arrangement (e.g., to facilitate load sharing). Additionally, while two node computing devices are illustrated in FIG. 2, any number of node computing devices or data storage apparatuses can be included in other examples in other types of configurations or arrangements.

As illustrated in the clustered network environment 200, node computing devices 206(1)-206(n) can include various functional components that coordinate to provide a distributed storage architecture. For example, the node computing devices 206(1)-206(n) can include network modules 214(1)-214(n) and disk modules 216(1)-216(n). Network modules 214(1)-214(n) can be configured to allow the node computing devices 206(1)-206(n) (e.g., network storage controllers) to connect with client devices 208(1)-208(n) over the storage network connections 212(1)-212(n), for example, allowing the client devices 208(1)-208(n) to access data stored in the clustered network environment 200.

Further, the network modules 214(1)-214(n) can provide connections with one or more other components through the cluster fabric 204. For example, the network module 214(1) of node computing device 206(1) can access the data storage device 210(n) by sending a request via the cluster fabric 204 through the disk module 216(n) of node computing device 206(n) when the node computing device 206(n) is available. Alternatively, when the node computing device 206(n) fails, the network module 214(1) of node computing device 206(1) can access the data storage device 210(n) directly via the cluster fabric 204. The cluster fabric 204 can include one or more local and/or wide area computing networks (i.e., cloud networks) embodied as Infiniband, Fibre Channel (FC), or Ethernet networks, for example, although other types of networks supporting other protocols can also be used.

Disk modules 216(1)-216(n) can be configured to connect data storage devices 210(1)-210(n), such as disks or arrays of disks, SSDs, flash memory, or some other form of data storage, to the node computing devices 206(1)-206(n). Often, disk modules 216(1)-216(n) communicate with the data storage devices 210(1)-210(n) according to the SAN protocol, such as SCSI or FCP, for example, although other protocols can also be used. Thus, as seen from an operating system on node computing devices 206(1)-206(n), the data storage devices 210(1)-210(n) can appear as locally attached. In this manner, different node computing devices 206(1)-206(n), etc. may access data blocks, files, or objects through the operating system, rather than expressly requesting abstract files.

While the clustered network environment 200 illustrates an equal number of network modules 214(1)-214(n) and disk modules 216(1)-216(n), other examples may include a differing number of these modules. For example, there may be a plurality of network and disk modules interconnected in a cluster that do not have a one-to-one correspondence between the network and disk modules. That is, different node computing devices can have a different number of network and disk modules, and the same node computing device can have a different number of network modules than disk modules.

Further, one or more of the client devices 208(1)-208(n) can be networked with the node computing devices 206(1)-206(n) in the cluster, over the storage connections 212(1)-212(n). As an example, respective client devices 208(1)-208(n) that are networked to a cluster may request services (e.g., exchanging of information in the form of data packets) of node computing devices 206(1)-206(n) in the cluster, and the node computing devices 206(1)-206(n) can return results of the requested services to the client devices 208(1)-208(n). In one example, the client devices 208(1)-208(n) can exchange information with the network modules 214(1)-214(n) residing in the node computing devices 206(1)-206(n) (e.g., network hosts) in the data storage apparatuses 202(1)-202(n).

In one example, the storage apparatuses 202(1)-202(n) host aggregates corresponding to physical local and remote data storage devices, such as local flash or disk storage in the data storage devices 210(1)-210(n), for example. One or more of the data storage devices 210(1)-210(n) can include mass storage devices, such as disks of a disk array. The disks may comprise any type of mass storage devices, including but not limited to magnetic disk drives, flash memory, and any other similar media adapted to store information, including, for example, data and/or parity information.

The aggregates include volumes 218(1)-218(n) in this example, although any number of volumes can be included in the aggregates. The volumes 218(1)-218(n) are virtual data stores or storage objects that define an arrangement of storage and one or more filesystems within the clustered network environment 200. Volumes 218(1)-218(n) can span a portion of a disk or other storage device, a collection of disks, or portions of disks, for example, and typically define an overall logical arrangement of data storage. In one example volumes 218(1)-218(n) can include stored user data as one or more files, blocks, or objects that may reside in a hierarchical directory structure within the volumes 218(1)-218(n).

Volumes 218(1)-218(n) are typically configured in formats that may be associated with particular storage systems, and respective volume formats typically comprise features that provide functionality to the volumes 218(1)-218(n), such as providing the ability for volumes 218(1)-218(n) to form clusters, among other functionality. Optionally, one or more of the volumes 218(1)-218(n) can be in composite aggregates and can extend between one or more of the data storage devices 210(1)-210(n) and one or more of the cloud storage device(s) 236 to provide tiered storage, for example, and other arrangements can also be used in other examples.

In one example, to facilitate access to data stored on the disks or other structures of the data storage devices 210(1)-210(n), a filesystem may be implemented that logically organizes the information as a hierarchical structure of directories and files. In this example, respective files may be implemented as a set of disk blocks of a particular size that are configured to store information, whereas directories may be implemented as specially formatted files in which information about other files and directories are stored.

Data can be stored as files or objects within a physical volume and/or a virtual volume, which can be associated with respective volume identifiers. The physical volumes correspond to at least a portion of physical storage devices, such as the data storage devices 210(1)-210(n) (e.g., a Redundant Array of Independent (or Inexpensive) Disks (RAID system)) whose address, addressable space, location, etc. does not change. Typically the location of the physical volumes does not change in that the range of addresses used to access it generally remains constant.

Virtual volumes, in contrast, can be stored over an aggregate of disparate portions of different physical storage devices. Virtual volumes may be a collection of different available portions of different physical storage device locations, such as some available space from disks, for example. It will be appreciated that since the virtual volumes are not "tied" to any one particular storage device, virtual volumes can be said to include a layer of abstraction or virtualization, which allows it to be resized and/or flexible in some regards.

Further, virtual volumes can include one or more logical unit numbers (LUNs), directories, Qtrees, files, and/or other storage objects, for example. Among other things, these features, but more particularly the LUNs, allow the disparate memory locations within which data is stored to be identified, for example, and grouped as data storage unit. As such, the LUNs may be characterized as constituting a virtual disk or drive upon which data within the virtual volumes is stored within an aggregate. For example, LUNs are often referred to as virtual drives, such that they emulate a hard drive, while they actually comprise data blocks stored in various parts of a volume.

In one example, the data storage devices 210(1)-210(n) can have one or more physical ports, wherein each physical port can be assigned a target address (e.g., SCSI target address). To represent respective volumes, a target address on the data storage devices 210(1)-210(n) can be used to identify one or more of the LUNs. Thus, for example, when one of the node computing devices 206(1)-206(n) connects to a volume, a connection between the one of the node computing devices 206(1)-206(n) and one or more of the LUNs underlying the volume is created.

Respective target addresses can identify multiple of the LUNs, such that a target address can represent multiple volumes. The I/O interface, which can be implemented as circuitry and/or software in a storage adapter or as executable code residing in memory and executed by a processor, for example, can connect to volumes by using one or more addresses that identify the one or more of the LUNs.

Figure 3:
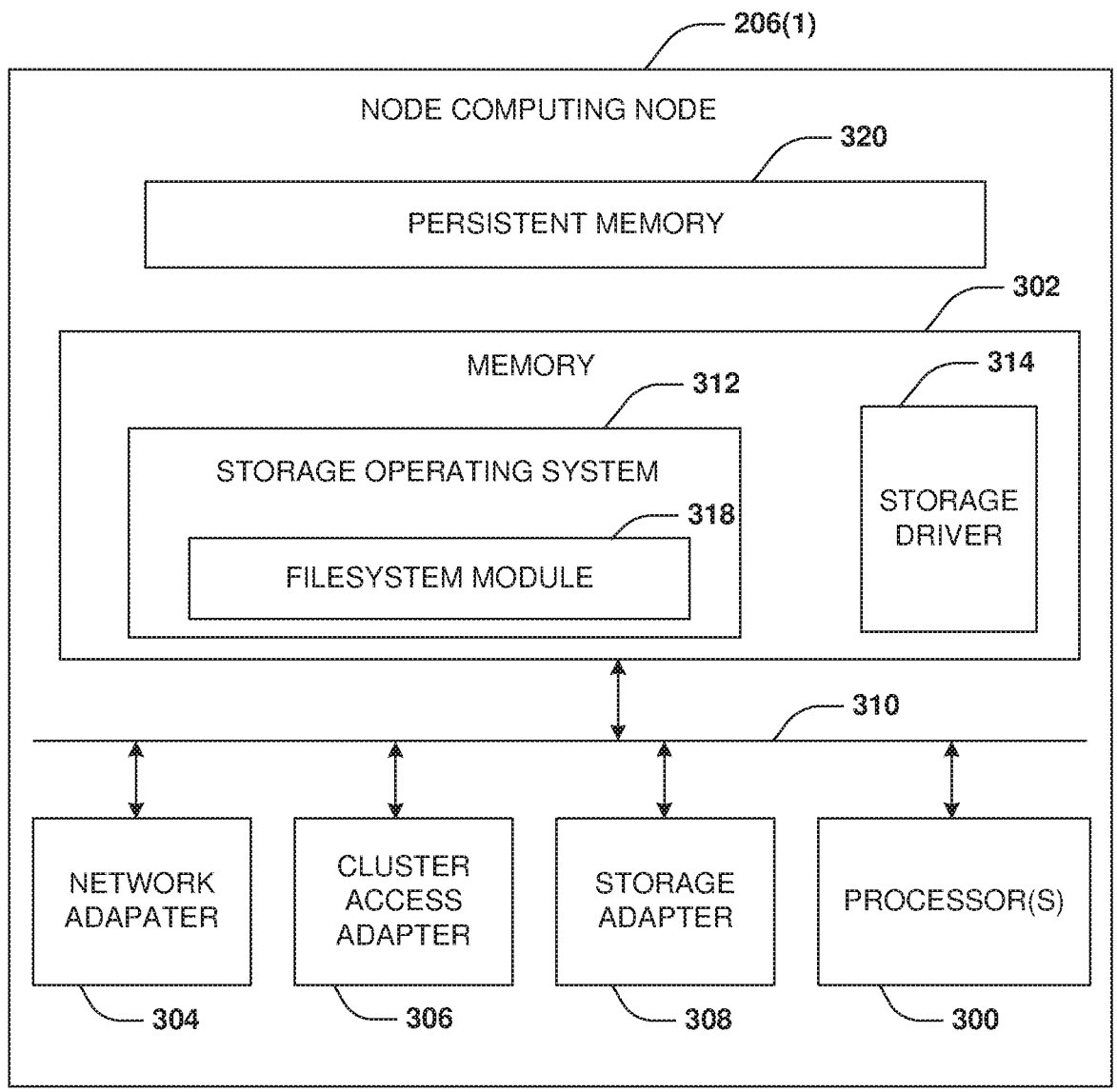
FIG. 3 is a block diagram illustrating an exemplary node computing device.

Referring to FIG. 3, node computing device 206(1) in this particular example includes processor(s) 300, a memory 302, a network adapter 304, a cluster access adapter 306, and a storage adapter 308 interconnected by a system bus 310. In other examples, the node computing device 206(1) comprises a virtual machine, such as a virtual storage machine. The node computing device 206(1) also includes a storage operating system 312 installed in the memory 302 that can, for example, implement a RAID data loss protection and recovery scheme to optimize reconstruction of data of a failed disk or drive in an array, along with other functionality such as deduplication, compression, snapshot creation, data mirroring, synchronous replication, asynchronous replication, encryption, etc. In some examples, the node computing device 206(n) is substantially the same in structure and/or operation as node computing device 206(1), although the node computing device 206(n) can also include a different structure and/or operation in one or more aspects than the node computing device 206(1). In an example, a file system may be implemented for persistent memory.

The network adapter 304 in this example includes the mechanical, electrical and signaling circuitry needed to connect the node computing device 206(1) to one or more of the client devices 208(1)-208(n) over network connections 212(1)-212(n), which may comprise, among other things, a point-to-point connection or a shared medium, such as a local area network. In some examples, the network adapter 304 further communicates (e.g., using TCP/IP) via the cluster fabric 204 and/or another network (e.g. a WAN) (not shown) with cloud storage device(s) 236 to process storage operations associated with data stored thereon.

The storage adapter 308 cooperates with the storage operating system 312 executing on the node computing device 206(1) to access information requested by one of the client devices 208(1)-208(n) (e.g., to access data on a data storage device 210(1)-210(n) managed by a network storage controller). The information may be stored on any type of attached array of writeable media such as magnetic disk drives, flash memory, and/or any other similar media adapted to store information.

In the exemplary data storage devices 210(1)-210(n), information can be stored in data blocks on disks. The storage adapter 308 can include I/O interface circuitry that couples to the disks over an I/O interconnect arrangement, such as a storage area network (SAN) protocol (e.g., Small Computer System Interface (SCSI), Internet SCSI (iSCSI), hyperSCSI, Fiber Channel Protocol (FCP)). The information is retrieved by the storage adapter 308 and, if necessary, processed by the processor(s) 300 (or the storage adapter 308 itself) prior to being forwarded over the system bus 310 to the network adapter 304 (and/or the cluster access adapter 306 if sending to another node computing device in the cluster) where the information is formatted into a data packet and returned to a requesting one of the client devices 208(1)-208(n) and/or sent to another node computing device attached via the cluster fabric 204. In some examples, a storage driver 314 in the memory 302 interfaces with the storage adapter to facilitate interactions with the data storage devices 210(1)-210(n).

The storage operating system 312 can also manage communications for the node computing device 206(1) among other devices that may be in a clustered network, such as attached to a cluster fabric 204. Thus, the node computing device 206(1) can respond to client device requests to manage data on one of the data storage devices 210(1)-210(n) or cloud storage device(s) 236 (e.g., or additional clustered devices) in accordance with the client device requests.

The file system module 318 of the storage operating system 312 can establish and manage one or more filesystems including software code and data structures that implement a persistent hierarchical namespace of files and directories, for example. As an example, when a new data storage device (not shown) is added to a clustered network system, the file system module 318 is informed where, in an existing directory tree, new files associated with the new data storage device are to be stored. This is often referred to as "mounting" a filesystem.

In the example node computing device 206(1), memory 302 can include storage locations that are addressable by the processor(s) 300 and adapters 304, 306, and 308 for storing related software application code and data structures. The processor(s) 300 and adapters 304, 306, and 308 may, for example, include processing elements and/or logic circuitry configured to execute the software code and manipulate the data structures.

In the example, the node computing device 206(1) comprises persistent memory 320. The persistent memory 320 comprises a plurality of pages within which data can be stored. The plurality of pages may be indexed by page block numbers.

The storage operating system 312, portions of which are typically resident in the memory 302 and executed by the processor(s) 300, invokes storage operations in support of a file service implemented by the node computing device 206(1). Other processing and memory mechanisms, including various computer readable media, may be used for storing and/or executing application instructions pertaining to the techniques described and illustrated herein. For example, the storage operating system 312 can also utilize one or more control files (not shown) to aid in the provisioning of virtual machines.

In this particular example, the memory 302 also includes a module configured to implement the techniques described herein, as discussed above and further below.

The examples of the technology described and illustrated herein may be embodied as one or more non-transitory computer or machine readable media, such as the memory 302, having machine or processor-executable instructions stored thereon for one or more aspects of the present technology, which when executed by processor(s), such as processor(s) 300, cause the processor(s) to carry out the steps necessary to implement the methods of this technology, as described and illustrated with the examples herein. In some examples, the executable instructions are configured to perform one or more steps of a method described and illustrated later.

Figure 4:
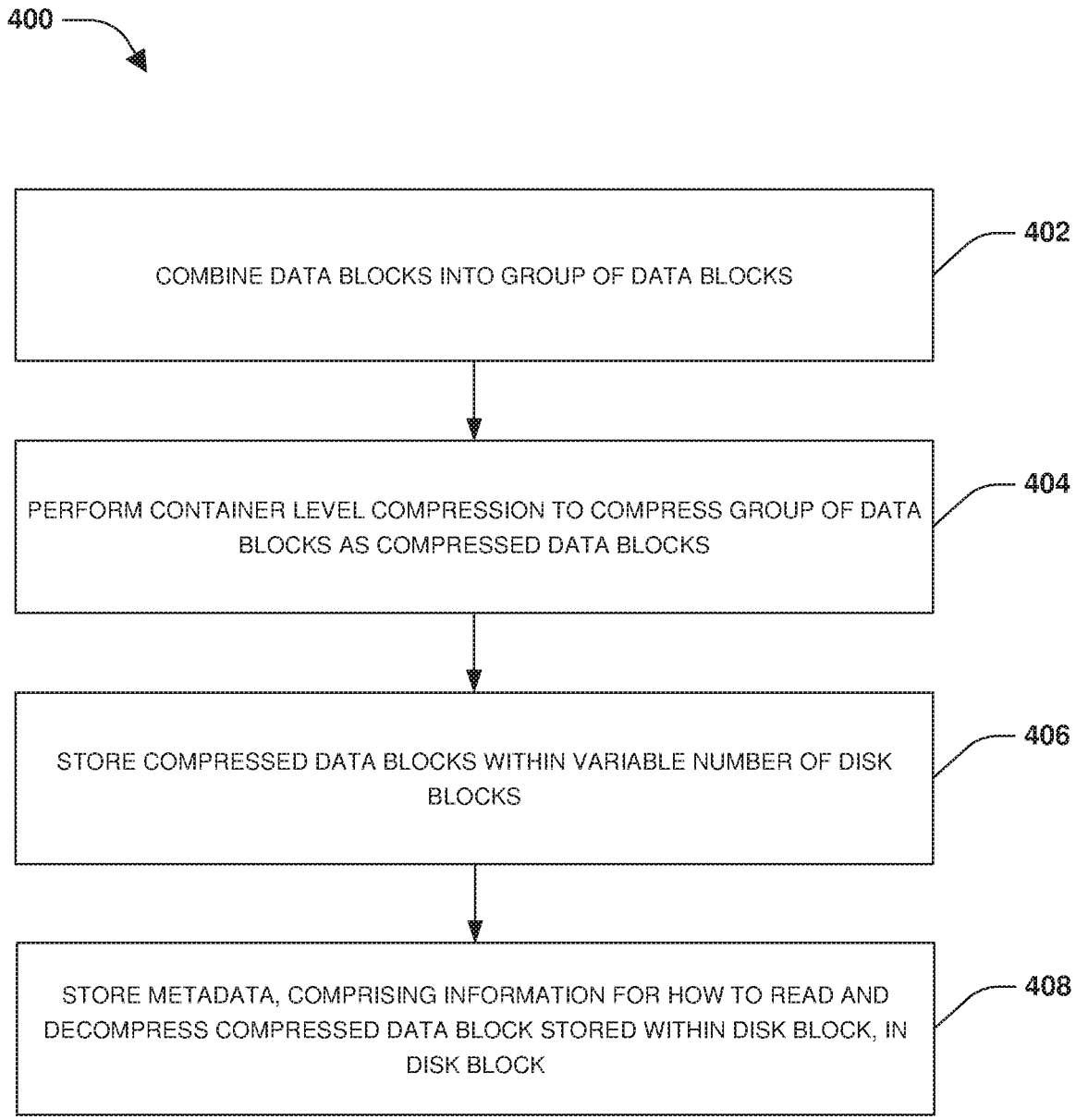
FIG. 4 is a flow chart illustrating an example method for implementing a layout format for compressed data.
Figure 5A:
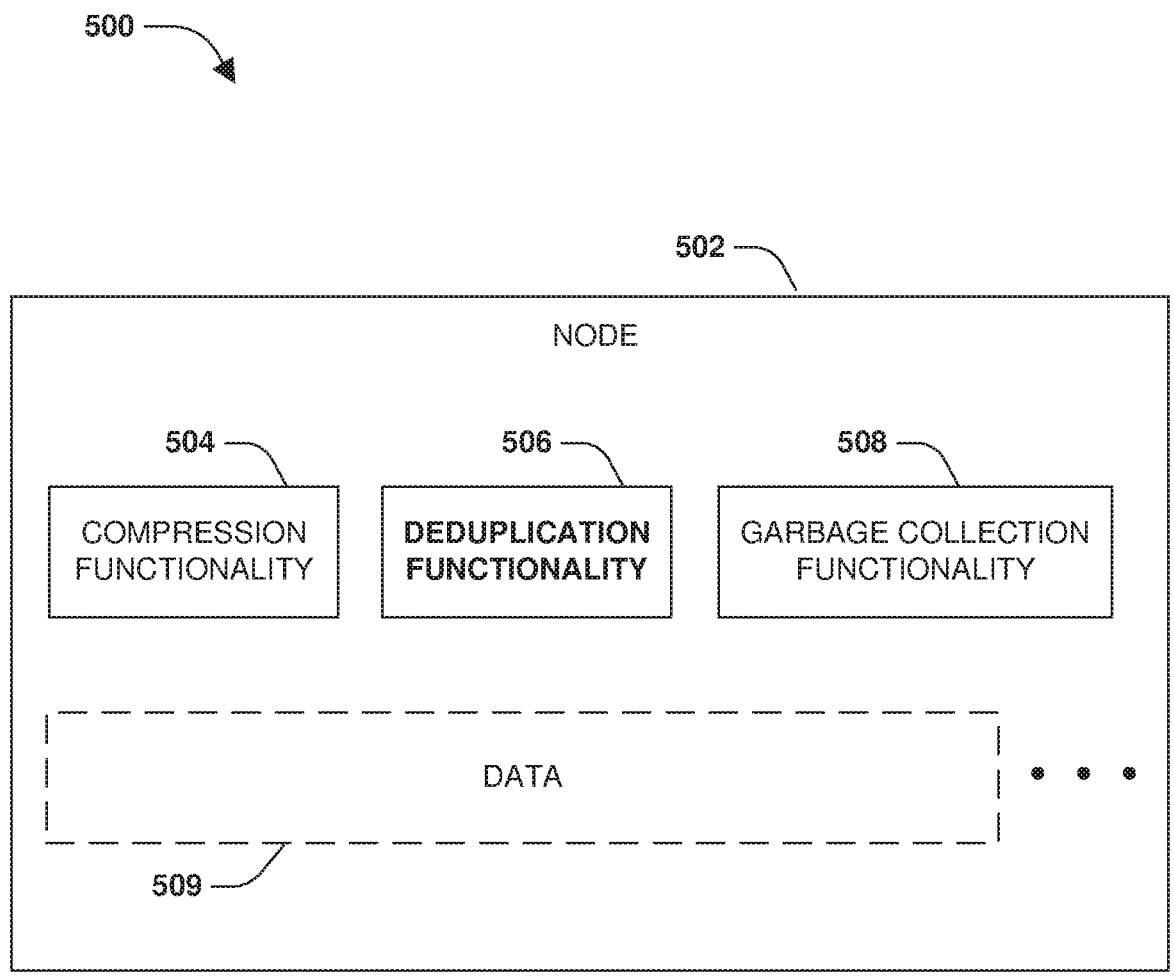
FIG. 5A is a block diagram illustrating an example system for implementing a layout format for compressed data, where data is deduplicated and grouped into groups.

One embodiment of implementing a layout format for compressed data is illustrated by an exemplary method 400 of FIG. 4, which is further described in conjunction with system 500 of FIGS. 5A-5D. A node 502 may store data 509 on behalf of client devices within storage, such as solid state drives, disk drives, memory, cloud storage, or a variety of other types of storage. The data 509 may be stored within disk blocks of physical storage, and may be organized by a file system for access by the client devices. As provided herein, the node 502 may provide storage efficiency functionality for more efficiently storing the data 509, along with a layout format for compressed data. In an embodiment, the node 502 may provide deduplication functionality 506 used to deduplicate the data 509 in order to improve storage efficiency by eliminated instances of redundantly stored data, as illustrated by FIG. 5A.

In an example of implementing the deduplication functionality 506, data blocks that are duplicated between files within the data 509 are rearranged within storage units such that one copy of the data occupies physical storage. References to the single copy of the data can be inserted into a file system structure such that all files or containers that contain the data refer to the same instance of the data within the physical storage. Deduplication can be performed on a data storage device block basis. In an example, data blocks on a storage device can be identified using a physical volume block number. The physical volume block number uniquely identifies a particular block on the storage device.

Additionally, blocks within a file can be identified by a file block number. The file block number is a logical block number that indicates the logical position of a block within a file relative to other blocks in the file. For example, file block number 0 represents the first block of a file, file block number 1 represents the second block, etc. File block numbers can be mapped to a physical volume block number that is the actual data block on the storage device. During deduplication operations, blocks in a file that contain the same data are deduplicated by mapping the file block number for the block to the same physical volume block number, and maintaining a reference count of the number of file block numbers that map to the physical volume block number. For example, assume that file block number 0 and file block number 5 of a file contain the same data, while file block numbers 1-4 contain unique data. File block numbers 1-4 are mapped to different physical volume block numbers. File block number 0 and file block number 5 may be mapped to the same physical volume block number, thereby reducing storage requirements for the file. Similarly, blocks in different files that contain the same data can be mapped to the same physical volume block number. For example, if file block number 0 of file A contains the same data as file block number 3 of file B, file block number 0 of file A may be mapped to the same physical volume block number as file block number 3 of file B.

In an embodiment of implementing the deduplication functionality 506 using the layout format, a set of the data 509 may be deduplicated by the deduplication functionality 506 to create a deduplicated set of data. The set of the data 509 may correspond to one or more files within a container (e.g., a volume or other container within which files can be organized). In an embodiment, the set of the data 509 may be deduplicated by the deduplication functionality 506 at logical block boundaries. For example, the set of the data 509 may be deduplicated at logical block boundaries of 4 kb or any other data block size used by a file system of the node to store the data 509. In an embodiment, the set of the data 509 may be deduplicated by the deduplication functionality 506 at a file level. For example, one or more select files within the container may be deduplicated, but other files may not be deduplicated by the deduplication functionality 506. In an example of deduplicating a data block within the set of the data 509, the data block may be deduplicated to point to a duplicate data block within the container based upon the data block comprising the same data as the duplicate data block. In an example, a single logical block within the set of the data 509 may point to multiple disk blocks after deduplication is performed by the deduplication functionality 506.

Figure 5B:
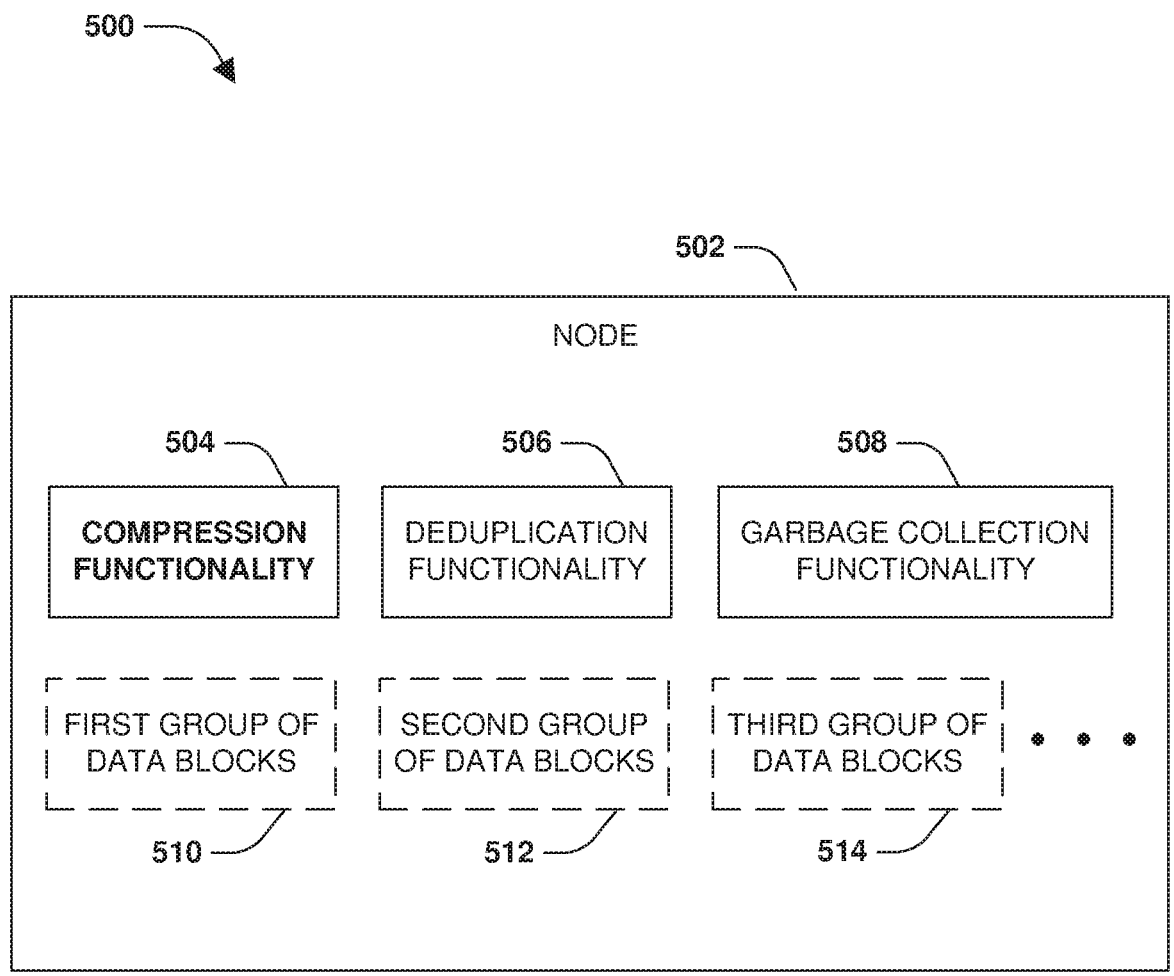
FIG. 5B is a block diagram illustrating an example system for implementing a layout format for compressed data, where data is grouped for compression.
Figure 5C:
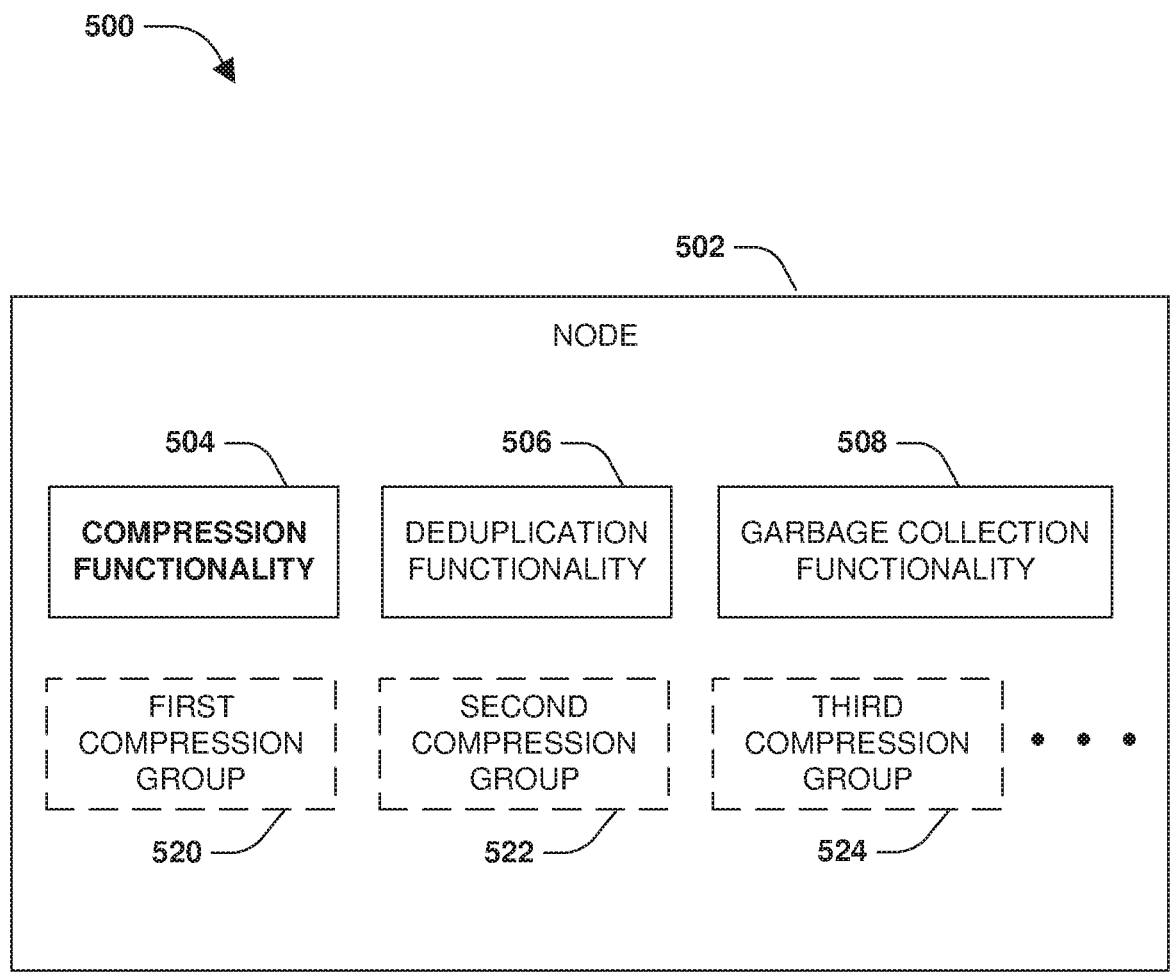
FIG. 5C is a block diagram illustrating an example system for implementing a layout format for compressed data, where groups of data blocks are compressed into compression groups.

As will be further described in conjunction with FIG. 5B and FIG. 5C, one or more sets/groups of data within the data 509 may be deduplicated prior to compressing the one or more sets/groups of data within the data 509. In this way, container level compression may be performed by compression functionality 504 of the node 502 upon the deduplicated set of data at a container level. That is, the deduplication functionality 506 deduplicates the data 509 at a file level such that individual files can be selectively deduplicated. In contrast, the compression functionality 504 compresses the data 509 at a container level, where a container (e.g., a volume or other data structure within which files can be organized and stored) comprises/contains one or more files. In an embodiment, deduplication of the data 509 may be optionally performed, and thus the data 509 may be compressed using the compression functionality 504 without deduplicating the data 509. That is, the compression functionality 504 and the deduplication functionality 506 of the node 502 may be separate and independent, such that the data 509 may be deduplicated by the deduplication functionality 506 or not, and similarly, the data 509 may be compressed by the compression functionality 504 or not.

In an embodiment of implementing the compression functionality 504, the data 509 may be grouped into one or more groups of data blocks, at 402. For example, the data 509 may be grouped by the compression functionality 504 into a first group of data blocks 510, a second group of data blocks 512, a third group of data blocks 514, and/or other data blocks, as illustrated by FIG. 5B. In this way, data blocks (e.g., data blocks storing at least some of the data 509) may be grouped into a group of data blocks by the compression functionality 504. The data blocks may be grouped based upon various criteria. In an embodiment, the data blocks may be grouped together by the compression functionality 504 based upon the data blocks comprising user data as opposed to other types of data such as metadata because the user data may have similar access patterns compared to the metadata. Similarly, the data blocks may be grouped together by the compression functionality 504 based upon the data blocks comprising metadata as opposed to other types of data such as user data because the metadata may have similar access patterns compared to the user data.

In an embodiment, the data blocks may be grouped together by the compression functionality 504 based upon the data blocks having similar access frequencies. For example, infrequently accessed data blocks may be grouped together into a group of data blocks, while frequently/recently accessed data blocks may be grouped together into a different group of data blocks than the infrequently accessed data blocks. In an embodiment, the data blocks may be grouped together into a group of data blocks by the compression functionality 504 based upon the data blocks comprising primary data that is actively available for access by client devices, while secondary backup data (e.g., data maintained as a replica of the primary data or a snapshot of a file system associated with the primary data) may be separately grouped together into a different group of data blocks than the primary data. In this way, similar types of data blocks may be grouped together into the same group of data blocks.

At 404, container level compression may be performed by the compression functionality 504 upon a group of data blocks to compress the group of data blocks as compressed data blocks within a compression group. In an example, the compression functionality 504 may implement a first compression algorithm to compress the group of data block to create the compressed data blocks. In an example, the compression functionality 504 may compress the first group of data blocks 510 using the first compression algorithm to create the first compression group 520, as illustrated by FIG. 5C. The compression functionality 504 may compress the second group of data blocks 512 using a compression algorithm (e.g., the first compression algorithm or a different compression algorithm) to create a second compression group 522. The compression functionality 504 may compress the third group of data blocks 514 using a compression algorithm (e.g., the first compression algorithm or a different compression algorithm) to create a third compression group 524.

In an embodiment, the compression functionality 504 may compress the group of data blocks using variable chunk size compression algorithms. In an embodiment, the compression functionality 504 may store a reference within a data block of a compression group (e.g., a data block maintained by the file system) to point to one or more disk blocks (e.g., disk blocks within a storage device) comprising compressed data of the data block. The reference within the data block may point to a single disk block or multiple disk blocks comprising the compressed data of the data block, and thus a data block of the file system may point to multiple disks blocks of a storage device. In an embodiment, the compression functionality 504 may represent a disk location of a disk block (e.g., a physical location within the storage device) comprising compressed data of a data block of the compression group using an encoding. The disk location may be encoded within a file system indirect block (e.g., an indirect block of a file system that points to the data block whose data is stored within the disk block). The disk location may be encoded by encoding disk block information as a starting disk block number and a count of disk blocks (e.g., a number of disk blocks, from a starting disk block, at which the disk block is located within the storage) within the file system indirect block.

At 406, compressed data blocks of a compression group are stored within a variable number of disk blocks by the compression functionality 504, at 408. That is, the compressed data blocks are not limited to being stored within a set number of disk blocks, but can be stored in a variable number of disk blocks. The compression functionality 504 may generate metadata for the compressed data blocks of the compression group. For example, the compression functionality 504 may generate first metadata for a first compressed data block within the first compression group 520. The first metadata may comprise information for decompressing the first compressed data block. The first metadata may comprise information for how to read the first compressed data block. The compression functionality 504 may store the first metadata in a disk block within which the first compressed data block is stored, at 408. In this way, the disk block comprises the first compressed data block, along with the information of the first metadata used to read and decompress the first compressed data block. In response to receiving a request to access the first compressed data block within the disk block, the first metadata within the disk block is utilized to decompress and read the first compressed data block.

In an embodiment of implementing the compression functionality 504, a first set of data blocks are grouped into a first group based upon a first frequency of access to the first set of data blocks. For example, the first set of data blocks are accessed less than a threshold frequency, and thus are grouped together into the first group. A second set of data blocks are grouped into a second group based upon a second frequency of access to the second set of data blocks. For example, the second set of data blocks are accessed greater than the threshold frequency, and thus are grouped together into the second group. In an embodiment, a first group size of the first group is independent of a second group size of the second group, such that the first group size and the second group size may be the same size or different sizes.

The compression functionality 504 may compress the first set of data blocks within the first group into a first compression group using a first compression algorithm. The compression functionality 504 may compress the second set of data blocks within the second group into a second compression group using a second compression algorithm. The first compression algorithm and the second compression algorithm may be the same compression algorithm or different compression algorithms. The first compression algorithm may utilize a first compression size. The second compression algorithm may utilize a second compression size that is the same or different than the first compression size.

In an embodiment, a third set of data blocks are grouped into a third group based upon the third set of data blocks comprising secondary backup data (e.g., a backup of primary data actively accessible to client devices). The third set of data blocks within the third group may be compressed into a third compression grouping using a third compression algorithm. The third compression algorithm may be the same or different than the first compression algorithm and/or the second compression algorithm. The third compression algorithm may utilize a third compression size. The third compression size may be the same or different than the first compression size and/or the second compression size.

Figure 5D:
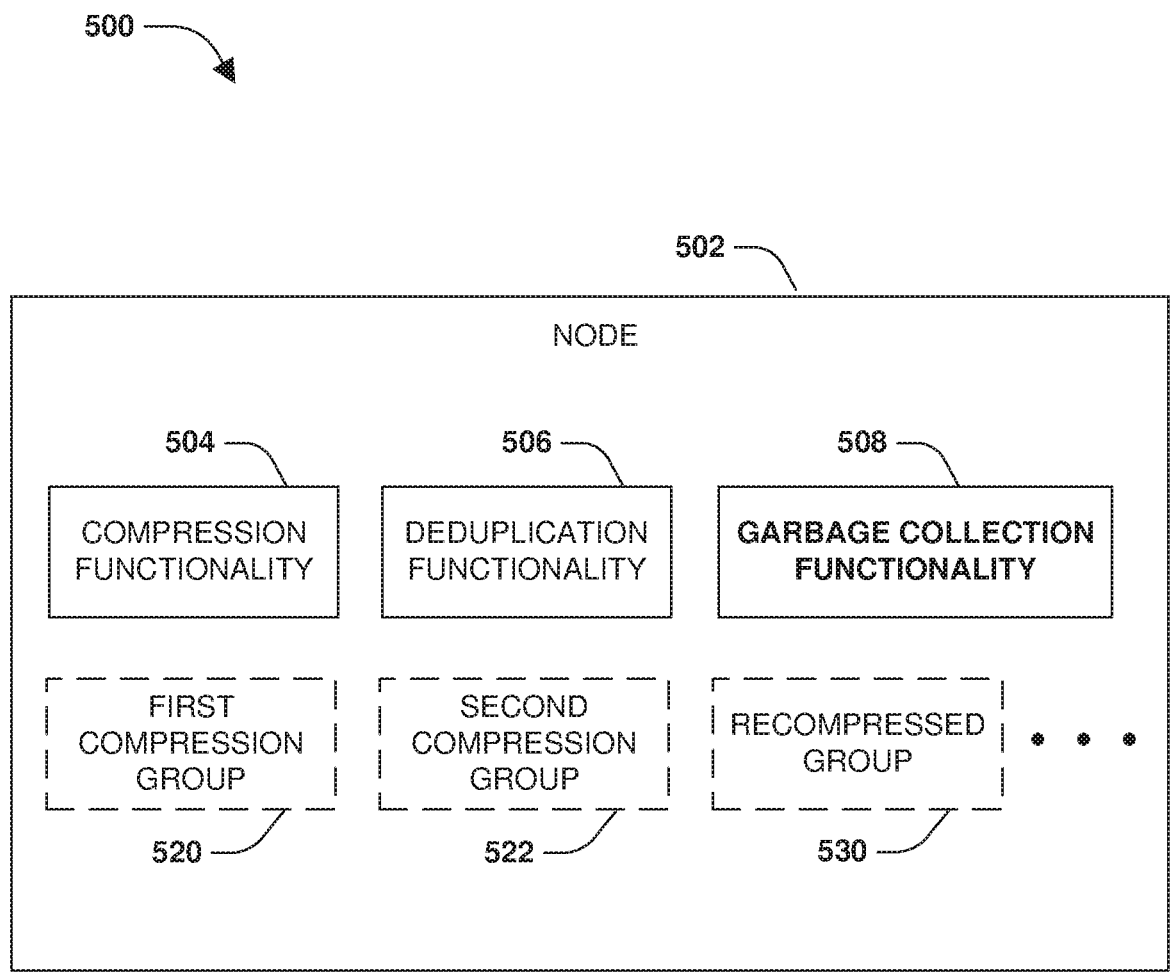
FIG. 5D is a block diagram illustrating an example system for implementing a layout format for compressed data, where garbage collection functionality is implemented.

In an embodiment, garbage collection functionality 508 may be implemented by the node 502 for the data 509, such as for deduplicated data and/or compressed data, as illustrated by FIG. 5D. The garbage collection functionality 508 may identify the third compression group 524 as comprising data that can be freed from storage. The garbage collection functionality 508 may decompress the compressed data blocks of the third compression group 524 as uncompressed data blocks. The garbage collection functionality 508 may free one or more of the uncompressed data blocks as freed data blocks that become available to store other data. The remaining uncompressed data blocks may be recompressed to create a recompressed group 530. In an embodiment, the garbage collection functionality 508 may asynchronously perform garbage collection to free disk blocks of storage based upon the disk blocks having a number of logical blocks pointing to the disk blocks that is less than a count of the disk blocks. Otherwise, the disk blocks may not be freed if the disk blocks have a number of logical blocks pointing to the disk blocks that is greater than a count of the disk blocks In an example of the layout format used to compress data blocks. A node may store data within storage as uncompressed data blocks, such as 8 uncompressed data blocks or any other number of compressed data blocks. Virtual volume block numbers 100 to 107 may correspond to 8 user data blocks that will be compressed together. The uncompressed data blocks may be compressed using a compression algorithm to create compressed data blocks, such as 5 data blocks (e.g., the 8 uncompressed data blocks are compressed into 5 data blocks). That is, the 8 user data blocks are compressed together such that the resulting on-disk storage is 5 blocks. In an example, the compressed data blocks are stored on-disk at 5 physical volume block numbers starting at physical volume block number 1000.

Disk locations of disk blocks comprising the compressed data blocks may be encoded as an encoding. The encoding may comprise an encoding of a physical volume block number. The encoding may comprise information corresponding to a number of compressed blocks, which may be stored within one or more bits. The encoding may comprise an actual physical volume block number. One or more bits are used to represent the number of physical volume block numbers where compressed data is stored. For example, the compressed data is stored at physical volume block number starting at 1000 and uses 5 physical volume block numbers. So, the 3 bits are set to '101' for binary 5, and the actual physical volume block number bits are set to 1000. This encoded physical volume block number value is written at P:1000,5.

In an example, a user file may be represented by a user file L1 format (e.g., a level 1 within a file system comprising the user file). The user file L1 format may comprise information for file block numbers of the user file. The user file L1 format may represent a format for a user file indirect block within a file system volume. Each slot within the user file L1 format represents a file block. Each slot points to a virtual volume block number value and a physical volume block number value for a corresponding file block. In this example, there are 8 virtual volume block numbers (100 to 107), which are compressed together to create compressed data that is stored at 5 physical volume block numbers starting at physical volume block number 100. These file blocks point to the virtual volume block numbers 100-107 and are encoded as physical volume block number P:1000,5.

In an example, a container comprising the user file and/or other user files may be represented by a container file (L1) format. The container file (L1) format may comprise information for virtual volume block numbers associated with the container. The container file (L1) format may represent a format for a container file within the file system volume. Each slots represents a container file mapping from virtual volume block number values to physical volume block number values. In this example, virtual volume block numbers 100-107 are compressed and the data is stored in 5 physical volume block numbers starting at physical volume block number 1000. So, each of the virtual volume block numbers 100-107 point to the encoded physical volume block number P:1000,5.

Figure 6:
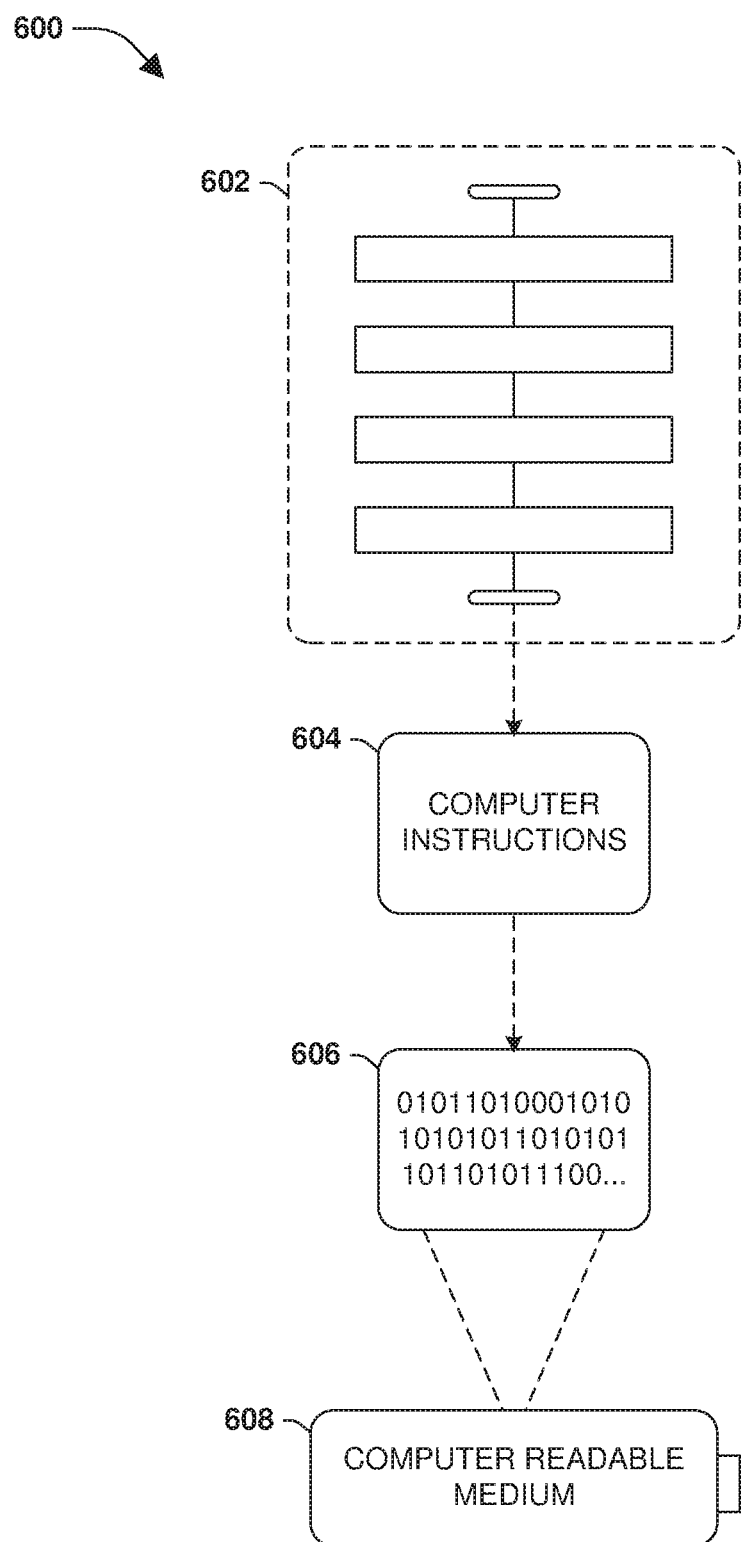
FIG. 6 is an example of a computer readable medium in which an embodiment of the invention may be implemented.

Still another embodiment involves a computer-readable medium 600 comprising processor-executable instructions configured to implement one or more of the techniques presented herein. An example embodiment of a computer-readable medium or a computer-readable device that is devised in these ways is illustrated in FIG. 6, wherein the implementation comprises a computer-readable medium 608, such as a compact disc-recordable (CD-R), a digital versatile disc-recordable (DVD-R), flash drive, a platter of a hard disk drive, etc., on which is encoded computer-readable data 606. This computer-readable data 606, such as binary data comprising at least one of a zero or a one, in turn comprises processor-executable computer instructions 604 configured to operate according to one or more of the principles set forth herein. In some embodiments, the processor-executable computer instructions 604 are configured to perform a method 602, such as at least some of the exemplary method 400 of FIG. 4, for example. In some embodiments, the processor-executable computer instructions 604 are configured to implement a system, such as at least some of the exemplary system 500 of FIGS. 5A-5D, for example. Many such computer-readable media are contemplated to operate in accordance with the techniques presented herein.

In an embodiment, the described methods and/or their equivalents may be implemented with computer executable instructions. Thus, in an embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on. In an embodiment, a computing device is implemented with one or more executable algorithms that are configured to perform any of the disclosed methods.

It will be appreciated that processes, architectures and/or procedures described herein can be implemented in hardware, firmware and/or software. It will also be appreciated that the provisions set forth herein may apply to any type of special-purpose computer (e.g., file host, storage server and/or storage serving appliance) and/or general-purpose computer, including a standalone computer or portion thereof, embodied as or including a storage system. Moreover, the teachings herein can be configured to a variety of storage system architectures including, but not limited to, a network-attached storage environment and/or a storage area network and disk assembly directly attached to a client or host computer. Storage system should therefore be taken broadly to include such arrangements in addition to any subsystems configured to perform a storage function and associated with other equipment or systems.

In some embodiments, methods described and/or illustrated in this disclosure may be realized in whole or in part on computer-readable media. Computer readable media can include processor-executable instructions configured to implement one or more of the methods presented herein, and may include any mechanism for storing this data that can be thereafter read by a computer system. Examples of computer readable media include (hard) drives (e.g., accessible via network attached storage (NAS)), Storage Area Networks (SAN), volatile and non-volatile memory, such as read-only memory (ROM), random-access memory (RAM), electrically erasable programmable read-only memory (EEPROM) and/or flash memory, compact disk read only memory (CD-ROM)s, CD-Rs, compact disk re-writeable (CD-RW)s, DVDs, cassettes, magnetic tape, magnetic disk storage, optical or non-optical data storage devices and/or any other medium which can be used to store data.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Furthermore, the claimed subject matter is implemented as a method, apparatus, or article of manufacture using standard application or engineering techniques to produce software, firmware, hardware, or any combination thereof to control a computer to implement the disclosed subject matter. The term "article of manufacture" as used herein is intended to encompass a computer application accessible from any computer-readable device, carrier, or media. Of course, many modifications may be made to this configuration without departing from the scope or spirit of the claimed subject matter.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, an application, or a computer. By way of illustration, both an application running on a controller and the controller can be a component. One or more components residing within a process or thread of execution and a component may be localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B and/or both A and B. Furthermore, to the extent that "includes", "having", "has", "with", or variants thereof are used, such terms are intended to be inclusive in a manner similar to the term "comprising".

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first set of information and a second set of information generally correspond to set of information A and set of information B or two different or two identical sets of information or the same set of information.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:

grouping a set of data blocks into a group;

compressing the set of data blocks into a compression group using a compression algorithm, wherein the set of data blocks is stored within a set of disk blocks of storage as compressed data blocks;

generating an encoding to identify disk locations of the set of disk blocks, wherein the encoding comprises a physical volume block number of a starting location of the compressed data blocks and an indication of a number of physical volume block numbers where the compressed data blocks are stored;

creating a compression data extent, within file system indirect block metadata, to include the set of disk blocks where compressed data of the compression group are stored;

representing the compression data extent in a file system indirect block that points to the compression data extent with the encoding for the set of disk blocks; and in response to determining that the set of disk blocks are to be freed:
  utilizing the encoding, within the file system indirect block pointing to the compression data extent, to identify disk space consumed by the set of disk blocks;
  deferring garbage collection work used to free the set of disk blocks;
  effectively counting, by a file system, the disk space consumed by the set of disk blocks as free space before the garbage collection work is performed to free the set of disk blocks consuming the disk space; and
  triggering performance of the garbage collection work based upon a threshold.

2. The method of claim 1, comprising:
in response to receiving a request to access a compressed data block, of the compressed data blocks, stored within a disk block of the set of disk blocks, utilizing metadata within the disk block to decompress the compressed data block.

3. The method of claim 2, comprising:
storing the metadata within the disk block that is a start of where the compressed data blocks are stored.

4. The method of claim 1, comprising:
storing metadata within a disk block of the set of disk blocks, wherein the metadata comprises information for how to read and decompress a compressed data block stored within the disk block.

5. The method of claim 1, comprising:
encoding the set of disk blocks in an indirect block; and
maintaining an overflow block for the indirect block, wherein the overflow block is populated with additional disk block information associated with the compressed data blocks.

6. The method of claim 1, comprising:
representing a disk location of a disk block of the set of disk blocks by encoding, within the file system indirect block, disk block information as a starting disk block number and a count of disk blocks of the set of disk blocks.

7. The method of claim 1, comprising:
performing the garbage collection by decompressing the compressed data blocks as decompressed data blocks, freeing one or more of the decompressed data blocks, and recompressing remaining decompressed data blocks.

8. The method of claim 1, comprising:
asynchronously performing the garbage collection to free disk blocks having a number of logical blocks pointing to the disk blocks less than a count of the disk blocks.

9. A non-transitory machine readable medium comprising instructions for performing a method, which when executed by a machine, causes the machine to:
group a set of data blocks into a group;
compress the set of data blocks into a compression group using a compression algorithm, wherein the set of data blocks is stored within a set of disk blocks of storage as compressed data blocks;
generate an encoding to identify disk locations of the set of disk blocks, wherein the encoding comprises a physical volume block number of a starting location of the compressed data blocks and an indication of a number of physical volume block numbers where the compressed data blocks are stored;
create a compression data extent, within file system indirect block metadata, to include the set of disk blocks where compressed data of the compression group are stored;
represent the compression data extent in a file system indirect block that points to the compression data extent with the encoding for the set of disk blocks; and
in response to determining that the set of disk blocks are to be freed:
  utilizing the encoding, within the file system indirect block pointing to the compression data extent, to identify disk space consumed by the set of disk blocks;
  deferring garbage collection work used to free the set of disk blocks;
  effectively counting, by a file system, the disk space consumed by the set of disk blocks as free space before the garbage collection work is performed to free the set of disk blocks consuming the disk space; and
  triggering performance of the garbage collection work based upon a threshold.

10. The non-transitory machine readable medium of claim 9, comprising:
utilizing the encoding to locate a disk location of a disk block within the set of disk blocks.

11. The non-transitory machine readable medium of claim 9, wherein the set of data blocks are data blocks accessed less than a threshold frequency.

12. The non-transitory machine readable medium of claim 9, wherein the set of data blocks are data blocks accessed greater than a threshold frequency.

13. The non-transitory machine readable medium of claim 9, comprising:
grouping a second set of data blocks into a second group based upon the second set of data blocks comprising secondary data.

14. The non-transitory machine readable medium of claim 13, comprising:
compressing the second set of data blocks within the second group into a second compression group using a second compression algorithm.

15. The non-transitory machine readable medium of claim 14, comprising:
deduplicating the set of data blocks and the second set of data blocks prior to compressing the set of data blocks and the second set of data blocks.

16. The non-transitory machine readable medium of claim 14, wherein the compression algorithm utilizes a first compression size and the second compression algorithm utilizes a second compression size different than the first compression size.

17. A computing device comprising:
a memory comprising machine executable code for performing a method; and
a processor coupled to the memory, the processor configured to execute the machine executable code to cause the processor to:
  group a set of data blocks into a group;
  compress the set of data blocks into a compression group using a compression algorithm, wherein the set of data blocks is stored within a set of disk blocks of storage as compressed data blocks;
  generate an encoding to identify disk locations of the set of disk blocks, wherein the encoding comprises a physical volume block number of a starting location of the compressed data blocks and an indication of a number of physical volume block numbers where the compressed data blocks are stored;

create a compression data extent, within file system indirect block metadata, to include the set of disk blocks where compressed data of the compression group are stored;

represent the compression data extent in a file system indirect block that points to the compression data extent with the encoding for the set of disk blocks; and in response to determining that the set of disk blocks are to be freed:
  utilizing the encoding, within the file system indirect block pointing to the compression data extent, to identify disk space consumed by the set of disk blocks;
  deferring garbage collection work used to free the set of disk blocks;
  effectively counting, by a file system, the disk space consumed by the set of disk blocks as free space before the garbage collection work is performed to free the set of disk blocks consuming the disk space; and
  triggering performance of the garbage collection work based upon a threshold.

18. The computing device of claim 17, wherein the machine executable code causes the processor to:
  deduplicate a data block, within the set of data blocks, to point to a duplicate data block within a container.

19. The computing device of claim 17, wherein deduplication of the data block is performed at logical block boundaries of 4 kb.

20. The computing device of claim 17, wherein the machine executable code causes the processor to:
  utilize the encoding to locate a disk location of a disk block within the set of disk blocks.

21. The computing device of claim 17, wherein the machine executable code causes the processor to:
  represent the compression data extent with the encoding based upon an assumption that the compressed data is stored within continuous storage blocks.

22. The computing device of claim 17, wherein the machine executable code causes the processor to:
  encode the set of disk blocks of the compression data extent into an indirect block; and
  maintain an overflow block for the indirect block to store additional block information associated with the set of disk blocks.

23. The computing device of claim 17, wherein the machine executable code causes the processor to:
  generate the encoding to represent the number of physical volume block numbers where the compressed data blocks are stored as bits set to a binary value of the number of physical volume block numbers.

24. The computing device of claim 23, wherein the machine executable code causes the processor to:
  generate the encoding to represent the physical volume block number of the starting location of the compressed data blocks as physical volume block number bits.

25. The computing device of claim 24, wherein the machine executable code causes the processor to:
  write an encoded physical volume block number for the compression group at the physical volume block number bits, the bits set to the binary value of the number of physical volume block numbers.

26. The computing device of claim 25, wherein the machine executable code causes the processor to:
  represent, as a slot, a container file mapping from virtual volume block number values to physical volume block number values of where the compressed data blocks are stored, wherein each virtual volume block number value points to the encoded physical volume block number.

* * * * *